US008013988B2

(12) United States Patent
Xiao et al.

(10) Patent No.: US 8,013,988 B2
(45) Date of Patent: Sep. 6, 2011

(54) APPARATUS FOR DETECTING ELECTROMAGNETIC WAVE

(75) Inventors: Lin Xiao, Beijing (CN); Yu-Ying Zhang, Beijing (CN); Kai-Li Jiang, Beijing (CN); Liang Liu, Beijing (CN); Shou-Shan Fan, Beijing (CN)

(73) Assignees: Tsinghua University, Beijing (CN); Hon Hai Precision Industry Co., ltd., Tu-Cheng, New Taipei (TW)

( * ) Notice: Subject to any disclaimer, the term of this patent is extended or adjusted under 35 U.S.C. 154(b) by 94 days.

(21) Appl. No.: 12/462,734

(22) Filed: Aug. 6, 2009

(65) Prior Publication Data

US 2010/0245808 A1 Sep. 30, 2010

(30) Foreign Application Priority Data

Mar. 25, 2009 (CN) .......................... 2009 1 0106405

(51) Int. Cl.
*G01J 1/42* (2006.01)
(52) U.S. Cl. ................ 356/218; 250/473.1; 250/370.01; 356/301; 356/303; 977/732; 977/954; 977/932
(58) Field of Classification Search .................. 356/218, 356/301–303; 977/732, 833, 834, 902, 954, 977/742, 932; 250/473.1, 370.01, 472.1
See application file for complete search history.

(56) References Cited

U.S. PATENT DOCUMENTS

2008/0067619 A1* 3/2008 Farahani et al. ............... 977/742
2009/0279390 A1* 11/2009 Jiang et al. .................... 977/902

FOREIGN PATENT DOCUMENTS

CN 101275867 A 10/2008

OTHER PUBLICATIONS

"Bolometric infrared photoresponse of suspended single-walled carbon nanotube films", Science, Mikhail E. Itkis et al, vol. 312, P412(2006).

* cited by examiner

*Primary Examiner* — Gregory J Toatley
*Assistant Examiner* — Iyabo S Alli
(74) *Attorney, Agent, or Firm* — Atlis Law Group, Inc.

(57) ABSTRACT

An apparatus for detecting electromagnetic wave includes an electromagnetic wave sensor, a first electrode and a second electrode spaced from each other and electrically connected to the electromagnetic wave sensor, and a measuring device electrically connected to the first electrode and the second electrode. The electromagnetic wave sensor includes a carbon nanotube structure. The carbon nanotube structure includes a plurality of carbon nanotubes extending along a same direction from the first electrode to the second electrode. The measuring device is capable of measuring resistance of the carbon nanotube structure.

20 Claims, 13 Drawing Sheets

Providing an apparatus, the apparatus includes an electromagnetic wave sensor, the electromagnetic wave sensor includes a carbon nanotube structure Irradiating the electromagnetic wave sensor in the apparatus with the electromagnetic wave with the polarizing direction to be measured, thereby changing the resistance of the carbon nanotube structure Rotating the electromagnetic wave sensor and measuring the resistance of the carbon nanotube structure during the rotating, thereby measuring the polarizing direction of the electromagnetic

FIG. 12

APPARATUS FOR DETECTING ELECTROMAGNETIC WAVE

RELATED APPLICATIONS

This application is related to copending application Ser. No. 12/459,546, filed Jul. 2, 2009, entitled, "METHOD AND DEVICE FOR MEASURING ELECTROMAGNETIC SIGNAL," and application Ser. No. 12/590,622, filed Nov. 12, 2009 entitled, "METHOD AND DEVICE FOR MEASURING POLARIZING DIRECTION OF ELECTROMAGNETIC WAVE."

BACKGROUND

1. Technical Field

The present disclosure relates to an apparatus for detecting electromagnetic waves and, particularly, to a carbon nanotube based apparatus for detecting polarizing direction of electromagnetic waves.

2. Description of Related Art

Polarizing direction and intensity are two important properties of an electromagnetic wave. One method for detecting the polarizing direction of a visible light includes disposing a polarizer and a target in the path of the visible light, and rotating the polarizer. The polarized visible light goes through the polarizer and irradiates the target. As the polarizer rotates, the light on the target changes periodically from the dark to the bright. When the light on the target is darkest, the polarizing direction of the visible light is perpendicular to the polarizing direction of the polarizer. When the light on the target is brightest, the polarizing direction of the visible light is parallel to the polarizing direction of the polarizer. Thus, one can tell the polarizing direction of the visible light by observing the light on the target. Similar, one can qualitatively tell the intensity of the visible light by observing the brightness or darkness of the visible light.

A conventional apparatus for detecting the intensity of electromagnetic waves includes a photoelectric sensor and two electrodes connected to the photoelectric sensor. In general, to detect the intensity of electromagnetic waves, the photoelectric sensor is irradiated by the electromagnetic waves. Thus, the incident electromagnetic waves can be transformed to electric signals by the photoelectric sensor, and the electric signals can be detected.

Carbon nanotubes (CNT) are a novel carbonaceous material having an extremely small size and an extremely large specific surface area. Carbon nanotubes have received a great deal of interest since the early 1990s, because they have interesting and potentially useful electrical and mechanical properties, and have been widely used in a plurality of fields. A disordered carbon nanotube film based apparatus for detecting electromagnetic waves is disclosed in "Bolometric infrared photoresponse of suspended single-walled carbon nanotube films", Science, Mikhail E. Itkis et al, vol 312, P 412(2006). The carbon nanotubes have a uniform absorbability of electromagnetic waves having different wavelengths. When the disordered carbon nanotube film is irradiated by electromagnetic waves having different wavelengths, the resistance of the disordered carbon nanotube film changes. Thus, the intensity of the incident electromagnetic waves can be detected by detecting the resistance of the irradiated disordered carbon nanotube film.

However, the above apparatus can only detect the intensity of electromagnetic waves, and not the polarizing direction thereof.

What is needed, therefore, is to provide an apparatus for detecting the intensity and the polarizing direction of electromagnetic waves.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

FIG. 12 is a flow chart of one embodiment of a method for measuring the electromagnetic wave.

DETAILED DESCRIPTION

Figure 1:
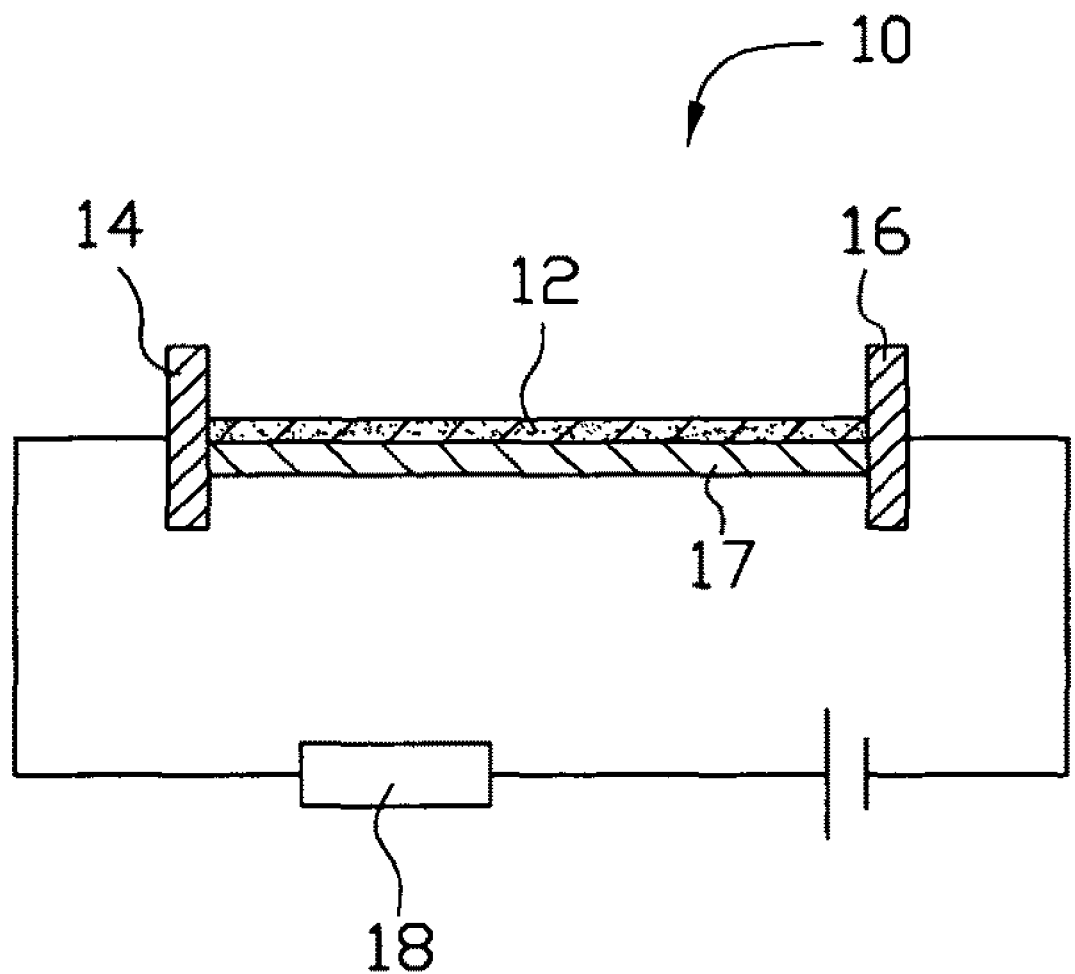
FIG. 1 is a schematic view of a first embodiment of an apparatus for detecting electromagnetic waves.

Referring to FIG. 1, a first embodiment of an apparatus 10 for detecting electromagnetic waves includes an electromagnetic wave sensor 12, a first electrode 14, a second electrode 16, and a measuring device 18. The first electrode 14 and the second electrode 16 are spaced apart from each other and electrically connected to the electromagnetic wave sensor 12. The measuring device 18 is electrically connected to the first and second electrodes 14, 16.

The electromagnetic wave sensor 12 includes a carbon nanotube structure. In one embodiment, the electromagnetic wave sensor 12 is made of the carbon nanotube structure.

The carbon nanotube structure is made only of a plurality of carbon nanotubes. The carbon nanotubes can be orderly arranged, so that the carbon nanotube structure including ordered carbon nanotubes is an ordered carbon nanotube structure. The term 'ordered carbon nanotube structure' refers to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotubes can be aligned approximately along a same direction from the first electrode 14 to the second electrode 16. The carbon nanotubes in the carbon nanotube structure can be single-walled, double-walled, or multi-walled carbon nanotubes. A diameter of each single-walled carbon nanotube ranges from about 0.5 nanometer (nm) to about 50 nm. A diameter of each double-walled carbon nanotube ranges from about 1 nm to about 50 nm. A diameter of each multi-walled carbon nanotube ranges from about 1.5 nm to about 50 nm.

The carbon nanotube structure can be a free-standing structure. The free-standing structure means the carbon nanotube structure can keep a certain shape without any supporter, which is different from powder or liquid. The carbon nanotube structure includes a plurality of carbon nanotubes joined to each other by van der Waals attractive force therebetween, thereby forming a certain shape. The carbon nanotube structure includes at least one carbon nanotube film, at least one carbon nanotube wire structure, or a combination thereof.

Carbon Nanotube Film

Figure 2:
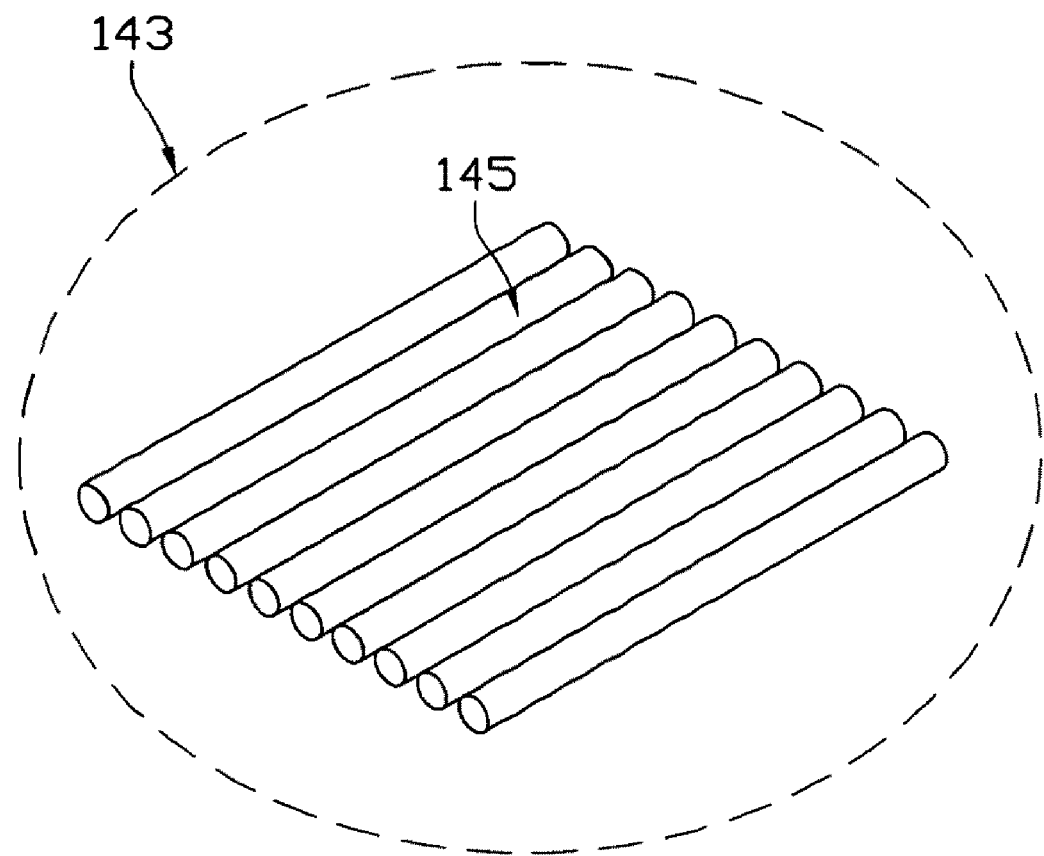
FIG. 2 is a structural schematic view of a carbon nanotube segment in a drawn carbon nanotube film used in the apparatus of FIG. 1.

In one embodiment, the carbon nanotube film includes at least one carbon nanotube segment. Referring to FIG. 2, each carbon nanotube segment 143 includes a plurality of carbon nanotubes 145 approximately parallel to each other, and combined by van der Waals attractive force therebetween. The carbon nanotube segments 143 can vary in width, thickness, uniformity, and shape. The carbon nanotubes 145 in the carbon nanotube segments 143 are also oriented along a preferred orientation.

Carbon Nanotube Film Manufactured by Method 1

Figure 3:
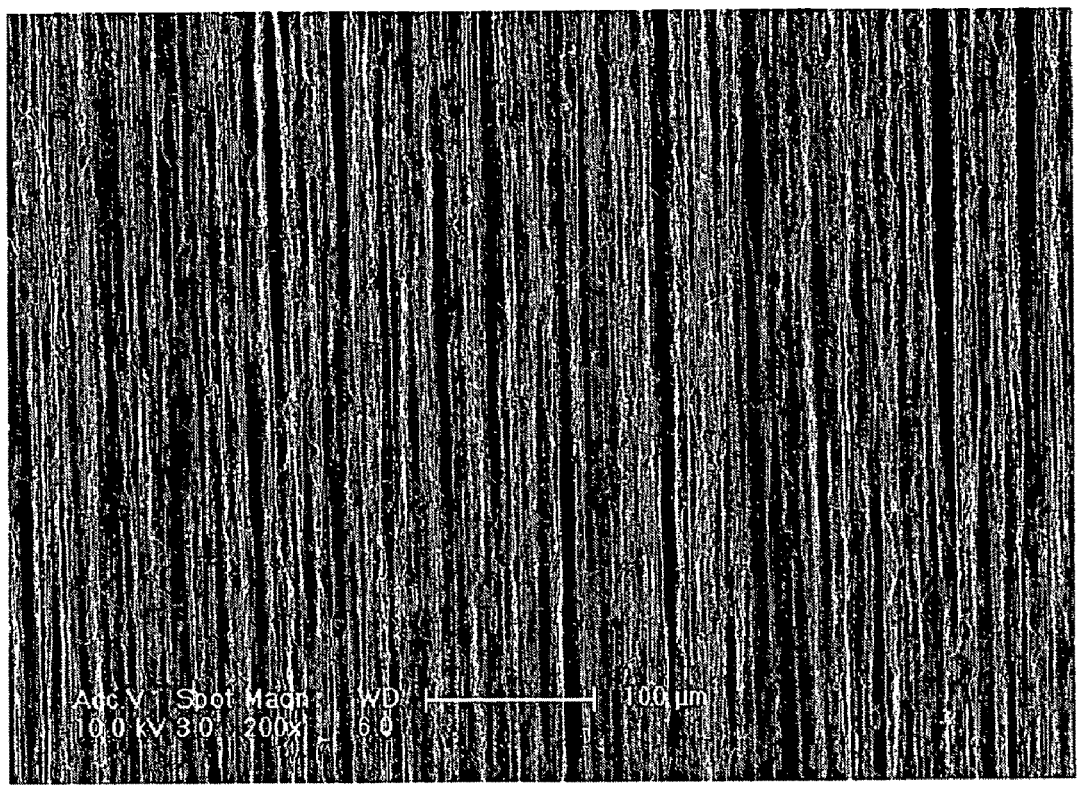
FIG. 3 shows a Scanning Electron Microscope (SEM) image of the drawn carbon nanotube film used in the apparatus of FIG. 1.

In one embodiment, the carbon nanotube film can be drawn from a carbon nanotube array, to form a drawn carbon nanotube film. In the present embodiment, the drawn carbon nanotube film can be pulled out from a super-aligned carbon nanotube array on a substrate. The drawn carbon nanotube film includes a plurality of successive and oriented carbon nanotubes 145 joined end to end by van der Waals attractive force. Referring to FIG. 3, each drawn carbon nanotube film includes a plurality of successively oriented carbon nanotube segments 143 joined end-to-end by van der Waals attractive force therebetween. The thickness of the drawn carbon nanotube film is in a range from about 0.5 nm to about 100 micrometers (μm). Examples of a drawn carbon nanotube film is taught by U.S. Pat. No. 7,045,108 to Jiang et al., and WO 2007015710 to Zhang et al.

Carbon Nanotube Film Manufactured by Method 2

Figure 4:
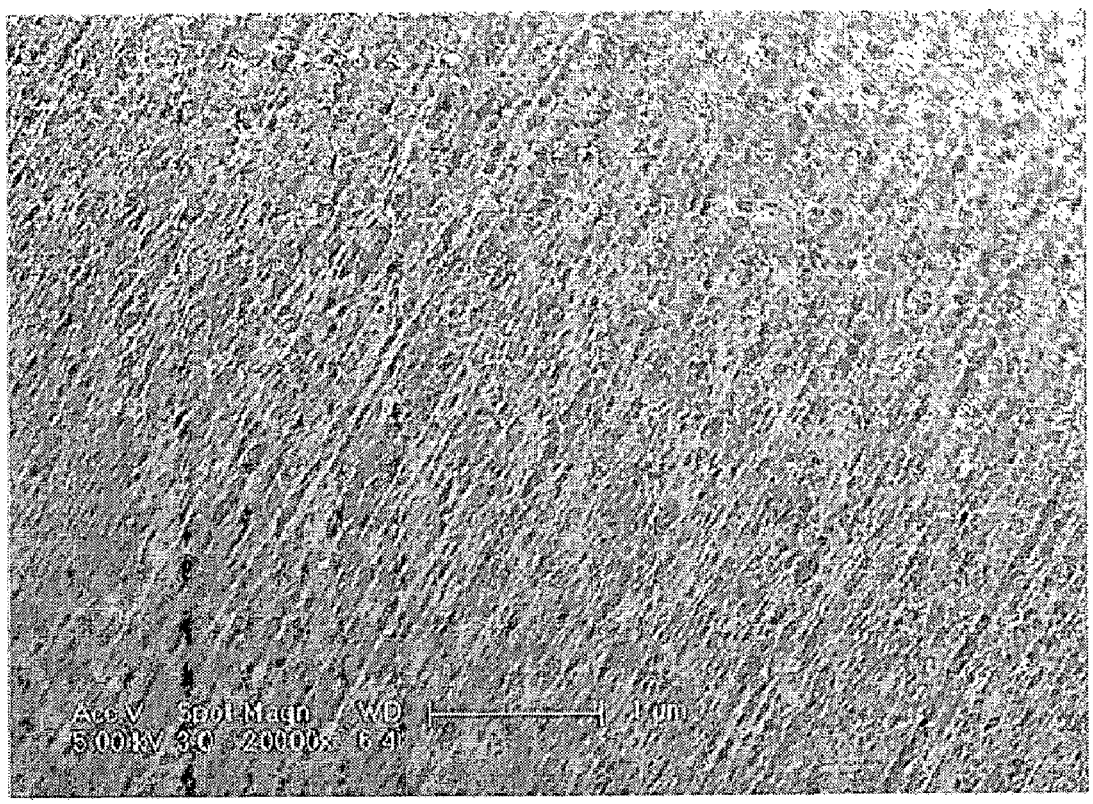
FIG. 4 shows a SEM image of a carbon nanotube film consisting of a carbon nanotube segment.

In another embodiment, the carbon nanotube film comprises of one carbon nanotube segment 143. Referring to FIG. 4, the carbon nanotube segment 143 includes a plurality of carbon nanotubes 145 substantially arranged along a same direction. The carbon nanotubes 145 in the carbon nanotube film are substantially parallel to each other and have almost equal lengths, and are combined side by side via van der Waals attractive force therebetween. The width of the carbon nanotube film is equal to the length of the carbon nanotubes 145, thus at least one carbon nanotube 145 spans the entire width of the carbon nanotube film. The carbon nanotube film can be produced by growing a strip-shaped carbon nanotube array, and pushing the strip-shaped carbon nanotube array down along a direction substantially perpendicular to a length of the strip-shaped carbon nanotube array, and has a length of about 20 μm to about 10 millimeters (mm). The length of the carbon nanotube film is only limited by the length of the strip. A larger carbon nanotube film also can be formed by having a plurality of the strips lined up side by side and folding the carbon nanotubes 145 grown thereon over such that there is overlap between the carbon nanotubes 145 on adjacent strips.

Carbon Nanotube Film Manufactured by Method 3

In some embodiments, the carbon nanotube film comprising one carbon nanotube segment 143 can also be produced by a method adopting a "kite-mechanism." The carbon nanotube film can have carbon nanotubes 145 with a length greater than 10 centimeters (cm). Specifically, the carbon nanotube film can be produced by providing a growing substrate with a catalyst layer located thereon, placing the growing substrate adjacent to the insulating substrate in a chamber, heating the chamber to a growth temperature for carbon nanotubes 145 under a protective gas, introducing a carbon source gas along a gas flow direction, and growing a plurality of carbon nanotubes 145 on the insulating substrate. After introducing the carbon source gas into the chamber, the carbon nanotubes 145 will start to grow under the effect of the catalyst. One end (e.g., the root) of the carbon nanotubes 145 is fixed on the growing substrate, and the other end (e.g., the top/free end) of the carbon nanotubes 145 will grow continuously. The growing substrate is near an inlet of the introduced carbon source gas, such that the carbon nanotubes 145 float above the insulating substrate with the roots of the carbon nanotubes 145 still attached on the growing substrate, as the carbon source gas is continuously introduced into the chamber. The length of the carbon nanotubes 145 depends on the growth conditions. After growth has been stopped, the carbon nanotubes 145 are disposed entirely on the insulating substrate. The carbon nanotubes 145 roots are then separated from the growing substrate. This can be repeated many times to obtain many layers of carbon nanotube films on a single insulating substrate. The adjacent carbon nanotubes 145 can be adhered together by van der Waals attractive force therebetween and being substantially parallel to each other, with a distance of adjacent carbon nanotubes 145 being less than 5 μm.

The carbon nanotube structure can include at least two stacked and/or coplanar carbon nanotube films. These coplanar carbon nanotube films can also be stacked one upon other films. The carbon nanotubes 145 in two adjacent carbon nanotube films are substantially parallel. Adjacent carbon nanotube films can be combined only by the van der Waals attractive force therebetween. The number of layers of the carbon nanotube films is not limited, so that a carbon nanotube structure can have different widths and areas. Stacking the carbon nanotube films will add to the structural strength of the carbon nanotube structure.

Carbon Nanotube Wire Structure

Figure 5:
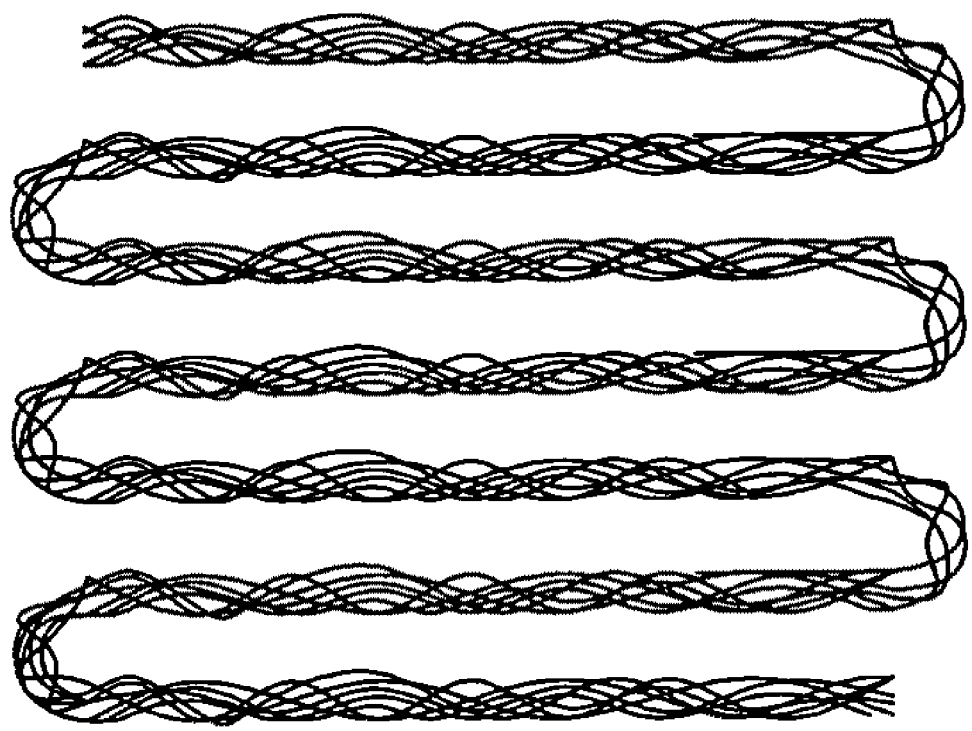
FIG. 5 is a structural schematic view of a carbon nanotube wire structure bent orderly in a surface in the apparatus of FIG. 1.

In other embodiments, the carbon nanotube structure includes one or more carbon nanotube wire structures. The carbon nanotube wire structure includes carbon nanotube cables that comprise of twisted carbon nanotube wires, untwisted carbon nanotube wires, or combinations thereof. The carbon nanotube cable comprises of two or more carbon nanotube wires, twisted or untwisted, that are twisted or bundled together. The carbon nanotube wires in the carbon nanotube wire structure can be substantially parallel to each other to form a bundle-like structure or twisted with each other to form a twisted structure. When the carbon nanotube structure includes a plurality of carbon nanotube wire structures, the carbon nanotube wire structures can be coplanar and substantially parallel to each other, or stacked and substantially parallel to each other. Referring to FIG. 5, when the carbon nanotube structure includes one carbon nanotube wire structure, the carbon nanotube wire structure bends orderly in a surface, thereby forming a planar structure, and the carbon nanotube wires of the carbon nanotube wire structure are substantially parallel to each other and arranged side by side besides the bend portions.

Figure 6:
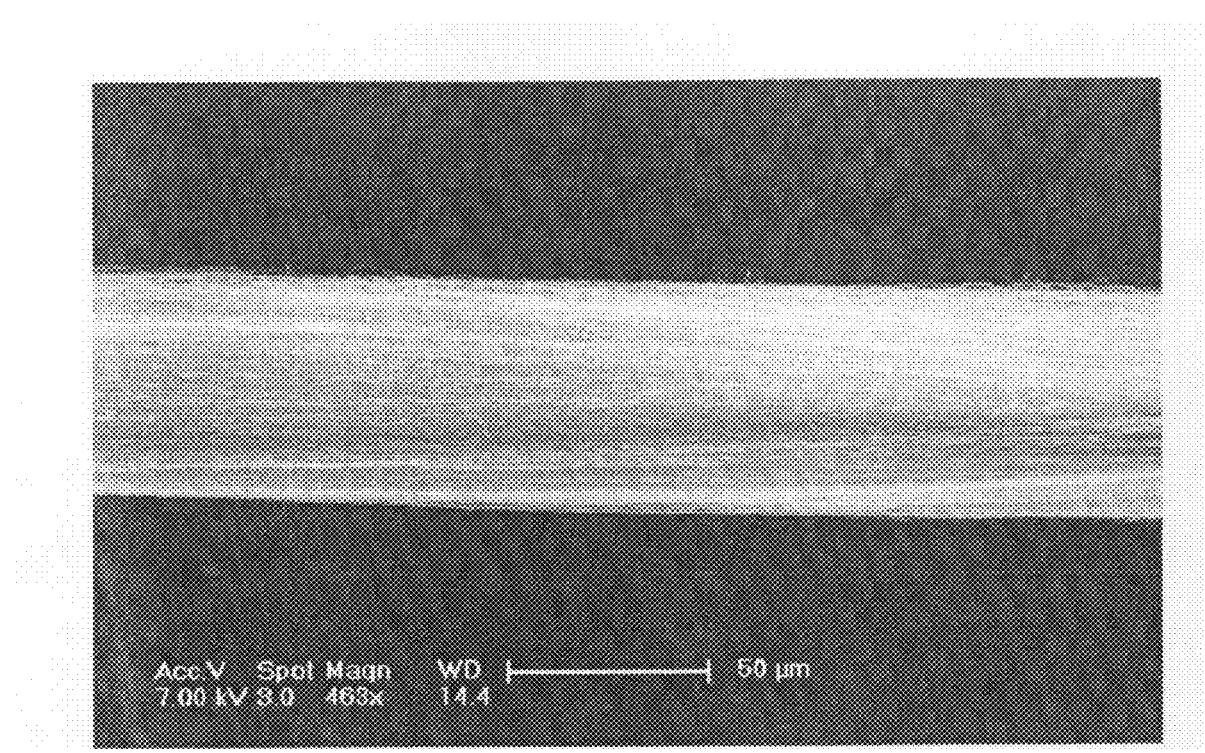
FIG. 6 is a SEM image of a non-twisted carbon nanotube wire used in the apparatus of FIG. 1.

The non-twisted carbon nanotube wire can be formed by treating the drawn carbon nanotube film with an organic solvent. Specifically, the drawn carbon nanotube film is treated by applying the organic solvent to the drawn carbon nanotube film to soak the entire surface of the drawn carbon nanotube film. After being soaked by the organic solvent, the adjacent parallel carbon nanotubes in the drawn carbon nanotube film will bundle together, due to the surface tension of the volatile organic solvent as the organic solvent volatilizes, and thus, the drawn carbon nanotube film will be shrunk into a non-twisted carbon nanotube wire. Referring to FIG. 6, the non-twisted carbon nanotube wire includes a plurality of carbon nanotubes substantially oriented along a same direction (e.g., a direction along the length of the non-twisted carbon nanotube wire). The carbon nanotubes are substantially parallel to the axis of the non-twisted carbon nanotube wire. Specifically, the non-twisted carbon nanotube wire includes a plurality of carbon nanotube segments joined end-to-end by van der Waals attractive force therebetween. Each carbon nanotube segment includes a plurality of carbon nanotubes substantially parallel to each other and combined by van der Waals attractive force. A length of the non-twisted carbon nanotube wire can be arbitrarily set as desired. A diameter of the non-twisted carbon nanotube wire can range from about 0.5 nm to about 100 µm. In one embodiment, the diameter of the non-twisted carbon nanotube wire is about 50 µm. Examples of the non-twisted carbon nanotube wire is taught by US Patent Application Publication US 2007/0166223 to Jiang et al.

Figure 7:
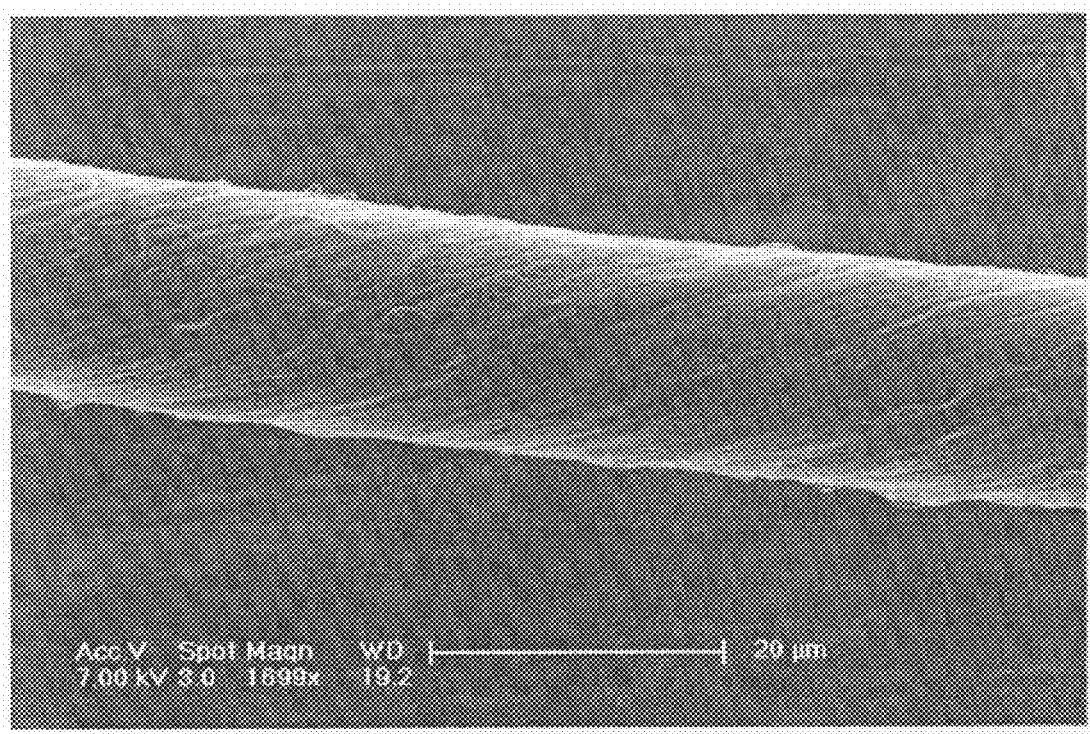
FIG. 7 is a SEM image of a twisted carbon nanotube wire used in the apparatus of FIG. 1.

The twisted carbon nanotube wire can be formed by twisting a drawn carbon nanotube film by using a mechanical force to turn the two ends of the drawn carbon nanotube film in opposite directions. Referring to FIG. 7, the twisted carbon nanotube wire includes a plurality of carbon nanotubes oriented around an axial direction of the twisted carbon nanotube wire. The carbon nanotubes are aligned in a helix around the axis of the carbon nanotube twisted wire. More specifically, the twisted carbon nanotube wire includes a plurality of successive carbon nanotube segments joined end-to-end by van der Waals attractive force therebetween. Each carbon nanotube segment includes a plurality of carbon nanotubes substantially parallel to each other and combined by van der Waals attractive force. The carbon nanotube segment has arbitrary length, thickness, uniformity, and shape. A length of the carbon nanotube wire can be arbitrarily set as desired. A diameter of the twisted carbon nanotube wire can range from about 0.5 nm to about 100 µm. Further, the twisted carbon nanotube wire can be treated with a volatile organic solvent, before or after being twisted. After being soaked by the organic solvent, the adjacent parallel carbon nanotubes in the twisted carbon nanotube wire will bundle together, due to the surface tension of the organic solvent as the organic solvent volatilizes. The specific surface area of the twisted carbon nanotube wire will decrease, but the density and strength of the twisted carbon nanotube wire will increase. It is understood that the twisted and non-twisted carbon nanotube cables can be produced by methods that are similar to the methods of making twisted and non-twisted carbon nanotube wires.

The mechanical stability of the apparatus 10 can be improved because the carbon nanotube wire structure has a higher strength. Thus, the lifespan of the apparatus 10 can be prolonged.

In one embodiment, the carbon nanotube structure is composed of at least one carbon nanotube film and at least one carbon nanotube wire structure. The carbon nanotubes in the carbon nanotube film are substantially parallel to the carbon nanotube wire structures.

The carbon nanotubes are close to an absolute blackbody. The carbon nanotubes have nearly uniform absorption ability over the entire electromagnetic spectrum including radio, microwave through far infrared, near infrared, visible, ultraviolet, X-rays, gamma rays, high energy gamma rays, and so on. The carbon nanotube structure absorbs the electromagnetic wave and converts the electromagnetic energy into heat energy. The heat capacity per unit area of the carbon nanotube structure is extremely low, the heat capacity per unit area of the carbon nanotube structure can be less than $2 \times 10^{-4}$ $J/cm^2 \cdot K$. In one embodiment, the heat capacity per unit area of the carbon nanotube structure is less than or equal to about $1.7 \times 10^{-6}$ $J/cm^2 \cdot K$, thus, the temperature of the carbon nanotubes can be rapidly changed by the intensity change of the input electromagnetic waves. The resistance of the carbon nanotube structure changes according to the temperature changes of the carbon nanotube structure. Therefore, the carbon nanotube structure can detect the intensity of electromagnetic waves in the range from microwatts to kilowatts.

In addition, in the carbon nanotube structure, the carbon nanotubes are substantially parallel and extend along a same direction, and thus, the electromagnetic wave is selectively absorbed by the carbon nanotube structure. The oscillations of the electromagnetic wave are in the plane perpendicular to the wave's direction of travel. In one embodiment, the electromagnetic wave's travel direction is substantially perpendicular to the surface of the carbon nanotube structure. The electromagnetic wave with oscillation (or oscillation vector) direction substantially parallel to the length orientation of the carbon nanotubes in the carbon nanotube structure is absorbed by the carbon nanotube structure. The electromagnetic wave with the oscillation (or oscillation vector) direction perpendicular to the length orientation of the carbon nanotubes in the carbon nanotube structure passes through the carbon nanotube structure. Thus, the electromagnetic wave with polarizing direction parallel to the length orientation of the carbon nanotubes is absorbed the most by the carbon nanotube structure. The electromagnetic wave with polarizing direction perpendicular to the length orientation of the carbon nanotubes mostly passes through the carbon nanotube structure. Changes in electromagnetic wave absorption intensity induce changes in the temperature of the carbon nanotube structure. The resistance of the carbon nanotube structure changes with respect to the changes in temperature of the carbon nanotube structure. The stronger the electromagnetic wave absorption of the carbon nanotube structure, the higher the temperature of the carbon nanotube structure, and the smaller the resistance of the carbon nanotube structure, and vice versa. The carbon nanotube structure can measure the intensity and polarizing direction of the electromagnetic wave according to the resistance changes of the carbon nanotube structure.

In one embodiment, the thickness of the carbon nanotube structure is about 0.5 nm to about 1 mm. The thickness of the carbon nanotube structure cannot be too thick such that the relative high heat capacity of the carbon nanotube structure will lower the temperature changes under electromagnetic illumination. Meanwhile, the thicker the carbon nanotube structure, the smaller the effective surface area will be. The reduction in the effective surface area will hamper sufficient heat exchange with the environment medium which results in a small response time of the apparatus 10. Furthermore, the thickness of the carbon nanotube structure cannot be too thin. If the thickness of the carbon nanotube structure is too thin, the carbon nanotube structure will be weak and can be easily damaged in the process of detecting electromagnetic waves, thereby reducing the lifespan of the carbon nanotube structure.

The first electrode 14 and the second electrode 16 are made of conductive material. The shape of the first electrode 14 or the second electrode 16 is not limited and can be lamellar, rod, wire, block, or other shapes. A material of the first and second electrodes 14, 16 can be one or more of metals, conductive adhesive, carbon nanotube, indium tin oxide, or other material. In one embodiment, the first electrode 14 and the second electrode 16 are rod-shaped metal electrodes. The carbon nanotubes in the carbon nanotube structure extend along a direction from the first electrode 14 to the second electrode 16. Some of the carbon nanotube structures have large specific surface area and better adhesion ability under the effect of the van der Waals attractive force and can be adhered directly to the first electrode 14 and the second electrode 16. This will result in good electrical contact between the carbon nanotube structure and the first and second electrodes 14, 16. Furthermore, a conductive adhesive layer (not shown) can be further provided between the first electrode 14 and/or the second electrode 16 and the carbon nanotube structure. The conductive adhesive layer can be applied to the surface of the carbon nanotube structure to provide electrical contact and better adhesion between the first and second electrodes 14, 16 and the carbon nanotube structure.

In one embodiment, the apparatus 10 can further include a supporting structure 17 to support the carbon nanotube structure. The carbon nanotube structure can be located on a surface of the supporting structure 17. Specifically, at least a part of the carbon nanotube structure can be adhered on the supporting structure 17 by a binder or merely by itself according to its adhesive nature. The supporting structure 17 can be made of a material having a relatively low thermal conductivity such as glass, rigid plastic, wood, or ceramic.

Further, for quantitatively measuring the polarizing direction and the intensity of the electromagnetic wave, the apparatus 10 can be connected to an electric circuit. The measuring device 18 can be an electric current measuring device (e.g., an ammeter) or a voltage measuring device (e.g., a voltmeter). In one embodiment, the electric current measuring device is adopted.

A method for measuring the intensity of an electromagnetic wave using the apparatus 10 can include:

(a) measuring the resistance R0 of the carbon nanotube structure without irradiated by the electromagnetic wave;

(b) irradiating the electromagnetic wave sensor 12 with an electromagnetic wave with determined intensity Is, and measuring the corresponding resistance Rs of the carbon nanotube structure using the measuring device 18, then calculating the resistance change rate (R0−Rs)/R0; and (c) repeating step (b) to obtain the relationship between the intensity of the electromagnetic waves and the resistance change rate (R0−Rs)/R0; and (d) irradiating the electromagnetic wave sensor 12 with an electromagnetic wave having an unknown intensity I to be measured, and measuring the resistance R of the carbon nanotube structure using the measuring device 18, then calculating the resistance change rate (R0−R)/R0. Thus, the corresponding electromagnetic intensity I can be determined according to the obtained relationship between the intensity of the electromagnetic waves and the resistance change rate (R0−Rs)/R0 in step (c).

Figure 8:
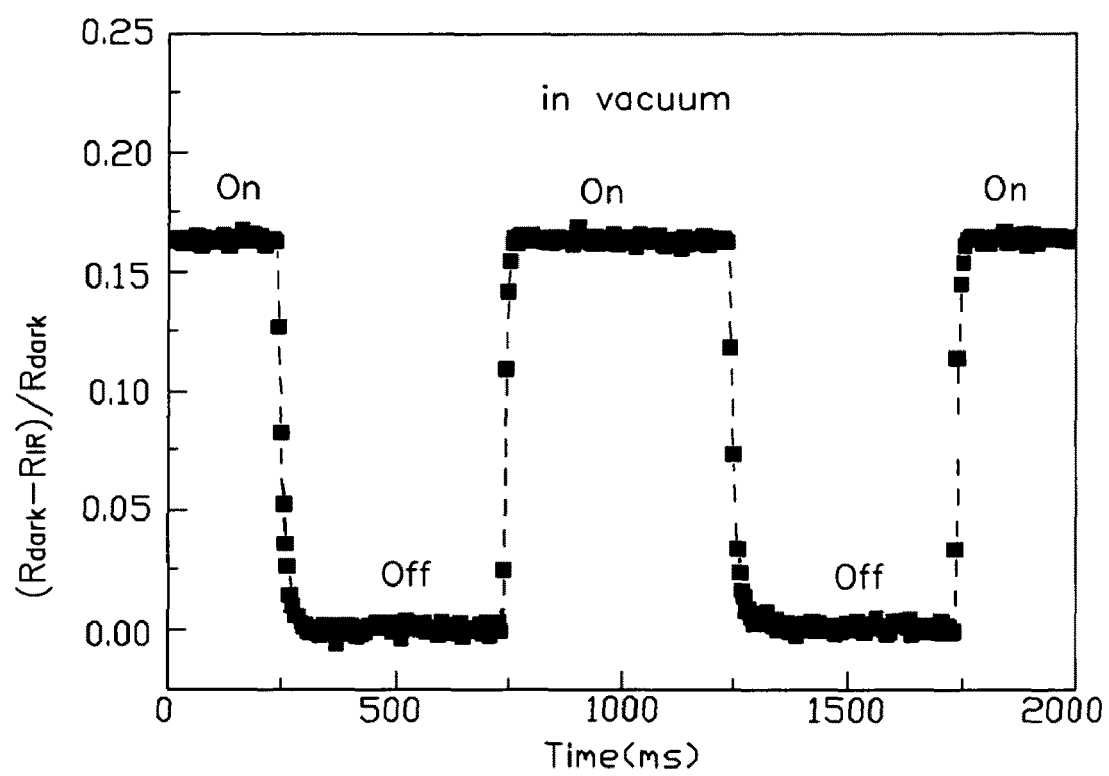
FIG. 8 is a diagram showing a relationship between a resistance changing rate of an electromagnetic wave sensor and a response time of the apparatus of FIG. 1 in vacuum.
Figure 9:
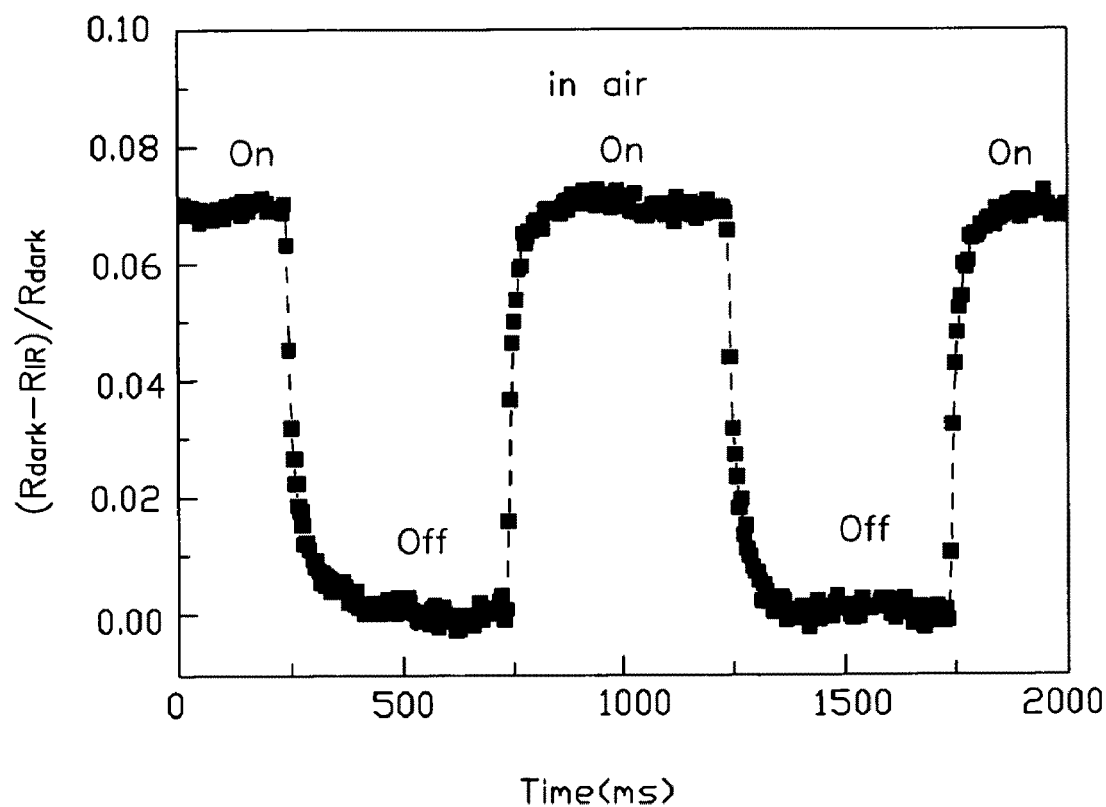
FIG. 9 is a diagram showing a relationship between the resistance changing rate of the electromagnetic wave sensor and the response time of the apparatus of FIG. 1 in non-vacuum.

Referring to FIGS. 8 and 9, the relation between a resistance change rate of the carbon nanotube film and a response time T of the carbon nanotube film when a carbon nanotube film is irradiated periodically by a same electromagnetic wave in vacuum and in air is shown. The carbon nanotube film used was a drawn carbon nanotube film. $R_{dark}$ represents the resistance of the non-irradiated carbon nanotube film, and $R_{IR}$ represents the resistance of the carbon nanotube film when being irradiated. The longitudinal axis $(R_{dark}-R_{IR})/R_{dark}$ represents the resistance change rate of the carbon nanotube film. The horizontal axis represents the response time T of the carbon nanotube film. The response time T of the carbon nanotube film is shorter at the beginning and the end of each period, wherein one period means a period during which the carbon nanotube film is continuously irradiated with an electromagnetic wave. The response time T is only about 15 milliseconds (ms) to about 50 ms at the time of the beginning and the end of each period. The response time T in vacuum is shorter than the response time in air.

Figure 10:
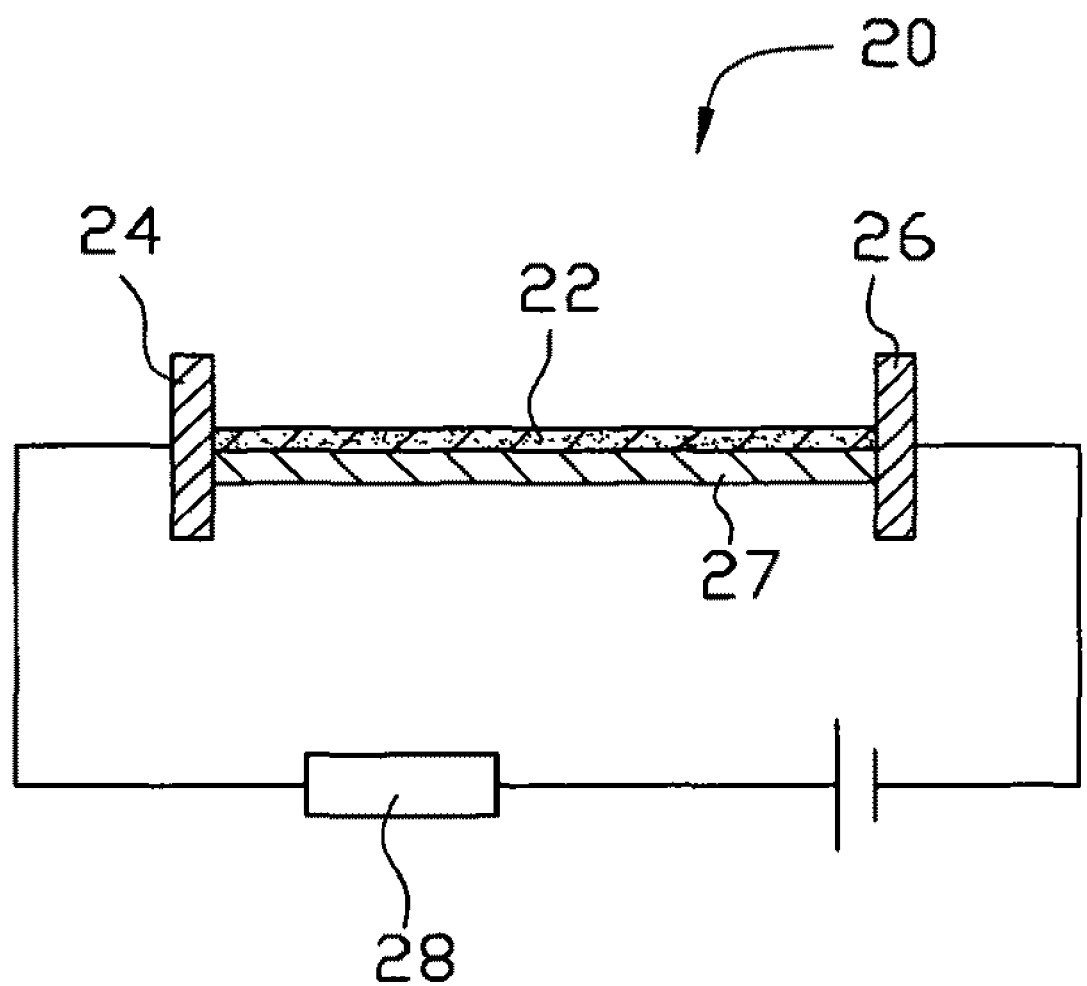
FIG. 10 is a schematic view of a second embodiment of an apparatus for detecting electromagnetic wave.

Referring to FIG. 10, a second embodiment of an apparatus 20 for detecting electromagnetic waves includes an electromagnetic wave sensor 22, a first electrode 24, and a second electrode 26. The first electrode 24 and the second electrode 26 are spaced apart from each other and electrically connected to the electromagnetic wave sensor 22. The apparatus 20 further includes a supporting structure 27 to support the electromagnetic wave sensor 22 and a measuring device 28 electrically connected to the electromagnetic wave sensor 22 by the first electrode 24 and the second electrode 26.

Figure 11:
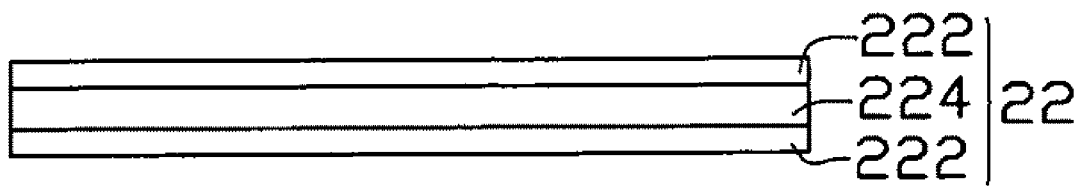
FIG. 11 is a schematic view of an electromagnetic wave sensor used in the apparatus of FIG. 10.

The apparatus 20 of the second embodiment is the same as the first embodiment except the electromagnetic wave sensor 22, which is a carbon nanotube composite structure, is different from the electromagnetic wave sensor 22 of the first embodiment. Referring to FIG. 11, the carbon nanotube composite structure includes at least one polymer material layer 222 and a carbon nanotube structure 224 composited with the polymer material layer 222. The carbon nanotube structure 224 is the same as the carbon nanotube structure of the first embodiment. The carbon nanotube structure 224 includes a plurality of carbon nanotubes, and a plurality of micropores defined by the adjacent carbon nanotubes. The polymer material in the polymer material layer 222 is at least partially penetrated in the micropores. The material of the polymer material layer 222 can be a light transmission organic polymer such as polymethyl methacrylate, polycarbonate, poly (ethyl acrylate), and poly(butyl acrylate).

Specifically, the method for fabricating the carbon nanotube composite structure can include: (a) immersing the carbon nanotube structure 224 in an organic solvent, or coating an organic solvent on the surfaces of the carbon nanotube structure 224; and (b) curing the organic solvent.

The polymer material layer 222 can further strengthen the electromagnetic wave sensor 22, thereby enlarging the application range of the electromagnetic wave measuring device 20.

The method for detecting the intensity of electromagnetic waves using the apparatus 20 is the same as the method using the apparatus 10 of the first embodiment.

Referring to FIG. 12, a method for detecting a polarizing direction of an electromagnetic wave includes:

(a) providing an apparatus 10, the apparatus 10 includes an electromagnetic wave sensor 12, the electromagnetic wave sensor 12 includes a carbon nanotube structure;

(b) irradiating the electromagnetic wave sensor 12 in the apparatus 10 with a electromagnetic wave with the polarizing direction to be measured, thereby changing the resistance of the carbon nanotube structure;

(c) rotating the electromagnetic wave sensor 12 and measuring the resistance of the carbon nanotube structure during rotation, thereby measuring the polarizing direction of the electromagnetic wave.

In step (a), the apparatus 10 for detecting the electromagnetic wave includes an electromagnetic wave sensor 12, a first electrode 14, and a second electrode 16. The electromagnetic wave sensor 12 includes a carbon nanotube structure. The carbon nanotube structure includes a plurality of carbon nanotubes substantially extending along a same direction from the first electrode 12 to the second electrode 14. The carbon nanotube structure can include a plurality of carbon nanotubes substantially parallel to each other, and the carbon nanotubes in the carbon nanotube structure are approximately parallel to a surface thereof.

In step (b), the electromagnetic wave irradiates the surface of the carbon nanotube structure. The electromagnetic wave with polarizing direction parallel to the length orientation of the carbon nanotubes is absorbed the most by the carbon nanotube structure. The electromagnetic wave with polarizing direction perpendicular to the length orientation of the carbon nanotubes mostly just passes through the carbon nanotube structure. The difference of the electromagnetic wave absorption intensity at different orientations of the carbon nanotube structure induces temperature changes in the carbon nanotube structure, thereby changing the resistance of the carbon nanotube structure. The stronger the electromagnetic wave absorption of the carbon nanotube structure, the higher the temperature of the carbon nanotube structure, and the smaller the resistance of the carbon nanotube structure, and vice versa. Therefore, when the angle between the polarizing direction of the electromagnetic wave and the length orientation of the carbon nanotubes in the carbon nanotube structure changes, the resistance of the carbon nanotube structure changes correspondingly.

In step (c), when the electromagnetic wave sensor 12 is rotated, the angle between the polarizing direction of the electromagnetic wave and the length orientation of the carbon nanotubes in the carbon nanotube structure can cause changes. The resistance of the carbon nanotube structure can be measured during rotation, thereby measuring the polarizing direction of the electromagnetic wave.

The method for detecting the polarizing direction of electromagnetic waves using the apparatus 20 is the same as the method using the apparatus 10 of the first embodiment.

Figure 13:
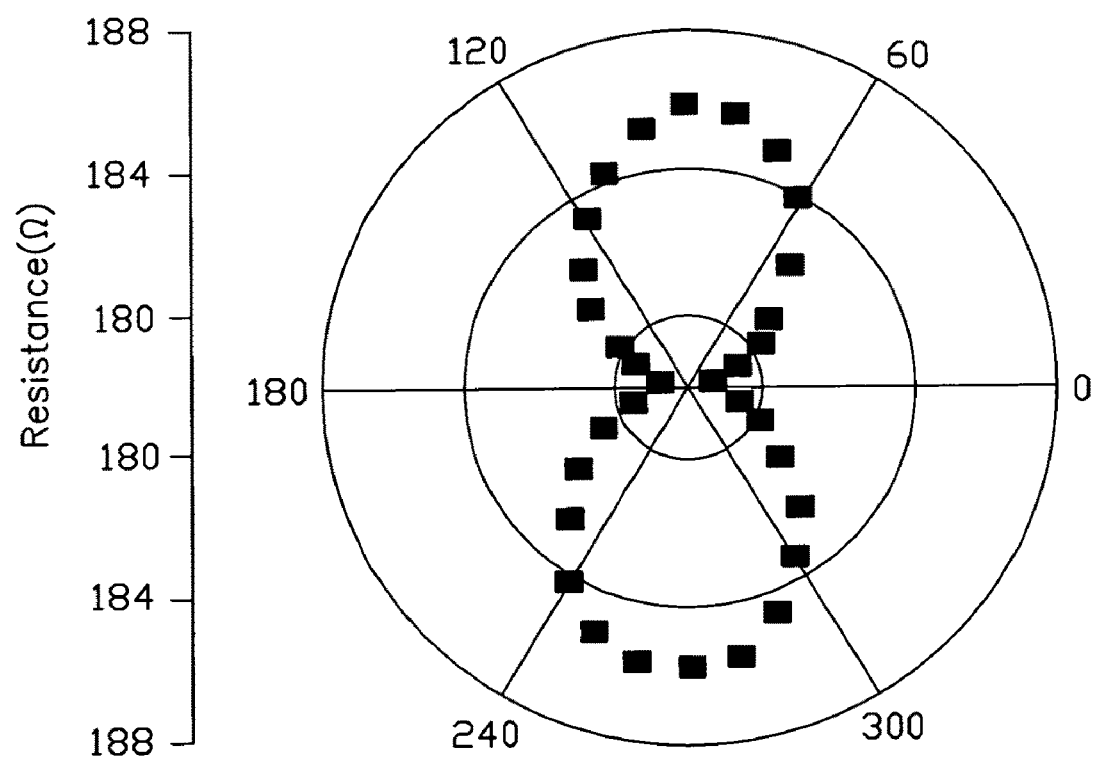
FIG. 13 is a diagram showing a relationship between a resistance of the electromagnetic wave sensor and an angle between a polarizing direction of the electromagnetic wave and a length direction of carbon nanotubes in a carbon nanotube structure in the apparatus of FIG. 1 and FIG. 2.

Referring to FIG. 13, in one embodiment, the relationship between the resistance of the carbon nanotube structure and the angle between the polarizing direction of the electromagnetic wave and the length orientation of the carbon nanotubes in the carbon nanotube structure is shown. When the angle between the polarizing direction of the electromagnetic wave and the length orientation of the carbon nanotubes in the carbon nanotube structure is 90 degrees, the resistance of the carbon nanotube structure is at a maximum. When the angle between the polarizing direction of the electromagnetic wave and the length orientation of the carbon nanotubes in the carbon nanotube structure is 0 degrees, the resistance of the carbon nanotube structure is at a minimum. Therefore, when the resistance of the carbon nanotube structure is maximum, the polarizing direction of the electromagnetic wave is perpendicular to the aligned direction of the carbon nanotubes in the carbon nanotube structure.

The carbon nanotube structure includes a plurality of carbon nanotubes aligned approximately along a same direction, thus the electromagnetic wave sensor 12, 22 has better conductivity and faster response time, and the apparatus 10, 20 can measure the intensity and the polarizing direction of the electromagnetic wave. Further, the carbon nanotube structure has a free standing structure, thus the electromagnetic wave sensor 12, 22 has higher strength and better stability, and the apparatus 10, 20 has better stability and longer lifespan. The method for measuring the electromagnetic wave is simple. The polarizing direction of the electromagnetic wave can be simply measured by rotating the carbon nanotube structure, measuring the resistance of the carbon nanotube structure during rotation, and determining the direction perpendicular to the aligned direction of the carbon nanotubes in the carbon nanotube structure when the maximum resistance is achieved.

It is to be understood that the above-described embodiments are intended to illustrate rather than limit the disclosure. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

What is claimed is:

1. An apparatus for detecting an electromagnetic wave, the apparatus comprising: an electromagnetic wave sensor receiving the electromagnetic wave to be measured, the electromagnetic wave sensor comprising a free-standing carbon nanotube structure, the carbon nanotube structure comprising a plurality of carbon nanotubes extending substantially along a same direction;
    a first electrode and a second electrode spaced from each other and electrically connected to the carbon nanotube structure; and
    a measuring device electrically connected to the first electrode and the second electrode to measure a resistance of the carbon nanotube structure.

2. The apparatus as claimed in claim 1, wherein the carbon nanotubes extend from the first electrode to the second electrode.

3. The apparatus as claimed in claim 1, wherein the carbon nanotube structure comprises at least one carbon nanotube film, the at least one carbon nanotube film comprises the plurality of carbon nanotubes approximately parallel to a surface of the at least one carbon nanotube film.

4. The apparatus as claimed in claim 3, wherein the carbon nanotube structure comprises a plurality of stacked or coplanar carbon nanotube films.

5. The apparatus as claimed in claim 1, wherein the carbon nanotube structure comprises at least one carbon nanotube wire structure.

6. The apparatus as claimed in claim 5, wherein the carbon nanotube structure comprises a carbon wire structure orderly bent in a surface.

7. The apparatus as claimed in claim 5, wherein a plurality of carbon nanotube wire structures is approximately parallel to each other.

8. The apparatus as claimed in claim 5, wherein the at least one carbon nanotube wire structure comprises at least one non-twisted carbon nanotube wire, the at least one non-twisted carbon nanotube wire comprises the plurality of carbon nanotubes parallel to an axis of the at least one non-twisted carbon nanotube wire.

9. The apparatus as claimed in claim 5, wherein the carbon nanotube wire structure comprises at least one twisted carbon nanotube wire, the at least one twisted carbon nanotube wire comprises the plurality of carbon nanotubes aligned in a helix around an axis of the at least one carbon nanotube twisted wire.

10. The apparatus as claimed in claim 1, further comprising a supporting structure, wherein the carbon nanotube structure in the electromagnetic wave sensor is supported by the supporting structure.

11. The apparatus as claimed in claim 1, wherein the measuring device is a current measuring device or a voltage measuring device.

12. The apparatus as claimed in claim 1, wherein the carbon nanotube structure is a drawn carbon nanotube film.

13. The apparatus as claimed in claim 1, wherein the carbon nanotube structure is a carbon nanotube film comprising the plurality of carbon nanotubes, at least one of the plurality of carbon nanotubes spans an entire length of the carbon nanotube film.

14. An apparatus for detecting an electromagnetic wave, the apparatus comprising: an electromagnetic wave sensor receiving the electromagnetic wave to be measured, the electromagnetic wave sensor comprising a carbon nanotube composite structure, the carbon nanotube composite structure comprising at least one polymer material layer and a carbon nanotube structure composited with the at least one polymer material layer, the carbon nanotube structure comprising a plurality of carbon nanotubes extending substantially along a same direction;
    a first electrode and a second electrode spaced from each other and electrically connected to the carbon nanotube composite structure; and
    a measuring device electrically connected to the first electrode and the second electrode to measure a resistance of the carbon nanotube composite structure.

15. The apparatus as claimed in claim 14, wherein the carbon nanotubes extend from the first electrode to the second electrode.

16. The apparatus as claimed in claim 14, wherein a material of the at least one polymer material layer is light transmission organic polymer.

17. The apparatus as claimed in claim 14, wherein the carbon nanotube structure defines a plurality of micropores, the light transmission organic polymer is at least partially penetrated in the plurality of micropores.

18. An apparatus for detecting a polarization direction of an electromagnetic wave, the apparatus comprising:
    an electromagnetic wave sensor receiving the electromagnetic wave to be measured, the electromagnetic wave sensor comprising at least one free-standing carbon nanotube film, the at least one carbon nanotube film comprising a plurality of carbon nanotubes extending substantially along a same direction;
    a first electrode and a second electrode spaced from each other and electrically connected to the at least one carbon nanotube film; and
    a measuring device electrically connected to the first electrode and the second electrode to measure a resistance of the at least one carbon nanotube film.

19. The apparatus as claimed in claim 18, wherein the electromagnetic wave sensor comprises a plurality of carbon nanotube films, the plurality of carbon nanotubes in two adjacent carbon nanotube films is substantially parallel to each other.

20. The apparatus as claimed in claim 1, wherein the plurality of carbon nanotubes is joined to each other by van der Waals attractive force.

\* \* \* \* \*